United States Patent
Whitacre et al.

(10) Patent No.: US 6,764,525 B1
(45) Date of Patent: Jul. 20, 2004

(54) METHOD FOR MANUFACTURING THIN-FILM LITHIUM MICROBATTERIES

(75) Inventors: Jay F. Whitacre, Pasadena, CA (US); Ratnakumar V. Bugga, Arcadia, CA (US); William C. West, So. Pasadena, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 66 days.

(21) Appl. No.: 10/390,258

(22) Filed: Mar. 11, 2003

Related U.S. Application Data

(62) Division of application No. 09/779,595, filed on Feb. 8, 2001, now Pat. No. 6,558,836.

(51) Int. Cl.[7] .............................. H01M 6/00; H01M 6/12

(52) U.S. Cl. ...................................... 29/623.2; 29/623.5

(58) Field of Search ................................ 29/623.2, 623.5

(56) References Cited

U.S. PATENT DOCUMENTS

| | | | |
|---|---|---|---|
| 5,338,625 A | 8/1994 | Bates et al. | ............. 429/127 X |
| 5,705,293 A | 1/1998 | Hobson | ..................... 429/162 |
| 6,168,884 B1 | 1/2001 | Neudecker et al. | ......... 429/162 |
| 6,264,709 B1 | 7/2001 | Yoon et al. | ................ 29/623.5 |
| 6,280,875 B1 | 8/2001 | Kwak et al. | ................ 429/162 |
| 2002/0071989 A1 * | 6/2002 | Verma et al. | .......... 29/623.5 X |

* cited by examiner

*Primary Examiner*—John S. Maples
(74) *Attorney, Agent, or Firm*—John H. Kusmiss

(57) ABSTRACT

A process for making thin-film batteries including the steps of cleaning a glass or silicon substrate having an amorphous oxide layer several microns thick; defining with a mask the layer shape when depositing cobalt as an adhesion layer and platinum as a current collector; using the same mask as the preceding step to sputter a layer of $LiCoO_2$ on the structure while rocking it back and forth; heating the substrate to 300° C. for 30 minutes; sputtering with a new mask that defines the necessary electrolyte area; evaporating lithium metal anodes using an appropriate shadow mask; and, packaging the cell in a dry-room environment by applying a continuous bead of epoxy around the active cell areas and resting a glass slide over the top thereof.

26 Claims, 7 Drawing Sheets

METHOD FOR MANUFACTURING THIN-FILM LITHIUM MICROBATTERIES

This is a divisional application of U.S. patent application Ser. No. 09/779,595 filed on Feb. 8, 2001, now U.S. Pat. No. 6,558,836.

ORIGIN OF THE INVENTION

The invention described herein was made in the performance of work under a NASA contract, and is subject to the provisions of Public Law 96-517 (35 USC 202) in which the contractor has elected not to retain title.

BACKGROUND OF THE INVENTION

1. Field of the Invention

The present invention relates to thin-film batteries compatible with integrated circuit manufacturing and in particular to the method for making the same.

2. Description of Related Art

There is an ever-expanding field where solid-state thin-film batteries may be used, including critical space exploration systems. Examples include battery-backed CMOS memory, MEMS switches, and micro sensors. In many of these applications, the ability to integrate a thin film battery directly onto a silicon integrated circuit chip next to the device to be powered would reduce overall device mass and volume as well as open up the possibility of distributing power at the chip level. The ability to deposit high capacity films onto flexible polymer substrates is also appealing.

The ideal thin-film battery has a capacity approaching theoretical levels for the materials system selected, minimal capacity loss over thousands of cycles, and materials and process steps that are compatible with common silicon-based fabrication methods.

In the recent past, RF magnetron sputtered $LiCoO_2$ thin films have emerged as a leading candidate for use as the cathode layer in thin film solid state batteries. Films that exhibit a (104) or (101) out-of-plane texture, have grains that are >100 nanometers in diameter, and display little to no lattice strain and are most efficient at lithium intercalation and electronic conduction. It has been shown elsewhere that an annealing step of typically 700° C. induces the desired film qualities. Because this heating step is too high for many desirable substrates, such as flexible polymer materials or silicon wafers with integrated CMOS devices, an effort has been undertaken to examine the possibility of creating $LiCoO_2$ films with the desired material qualities without using a high temperature process step. To reach this goal, it is critical to understand the deposition parameters that affect film crystallography and composition of $LiCoO_2$ when sputtered at room temperature.

A range of compositions have been observed in sputtered $LiCoO_2$. The Li/Co ratio has been reported to be 0.88 [9] or 1.0+/−0.1 when sputtered using a sputter gas consisting of 100% Argon. If sputter gases comprise $Ar:O_2$ mixes of 1:10 and 1:1, the Li/Co ratio was found to be 0.8+/−0.08 and 1.15+/−0.02, respectively. Concurrently, O/Co ratios ranging from 2.7 to 2.2 have been reported as well. In all cases, these films were found to be amorphous (per x-ray diffraction analysis) if deposited at room temperature and subsequently developed primarily a (003), (101), or (104) out-of-plane texture upon annealing at temperatures in excess of 600° C., depending on thickness.

In contrast to these results, preliminary experiments show that it is possible to deposit nano-crystalline $LiCoO_2$ films at room temperature. Some of these films have strong (104) out-of-plane textures and are found to have promising electrochemical properties.

SUMMARY OF THE INVENTION

The highest capacity thin film cathode layers ($LiCoO_2$) typically require an annealing step of 700° C. Since this high temperature is not compatible with silicon device technology or flexible polymer substrates, the development of a low process temperature (<300° C.) cathode layer is needed. $LiCoO_2$ thin-films were RF sputter deposited and subsequently incorporated into thin film batteries. A variety of deposition and post-deposition parameters were varied in an effort to optimize film microstructure and content. Film composition and microstructure were examined using a variety of techniques including x-ray diffraction using synchrotron radiation. It was found that $LiCoO_2$ could be deposited at room temperature in a nano-crystalline state with a strong (104) out of plane texture and a high degree of lattice distortion. By heating these layers to 300° C., the grain size is significantly increased while lattice distortion is eliminated. Cycling data reveals that the heating step increases cell capacity to near theoretical values (at lower discharge currents) while significantly improving both the rate capability and discharge voltage.

Accordingly, it is an object of the present invention to provide a thin film battery that has near-theoretical capacities and good discharge capabilities without exceeding temperatures of approximately 300° C. and are compatible with silicon processing techniques, which was heretofore a major problem.

Another object of the present invention is to provide a method for growing films with nano-crystalline grains oriented in the proper crystallographic direction at room temperature.

Yet another object of the present invention is to provide a simplified method for manufacturing thin-film batteries by heating the films to 300° C. in order to create cathode layers that have near state of the art performance.

These and other objects, which will become apparent as the invention is described in detail below, are provided by a process for making thin-film batteries including the steps of cleaning glass or a silicon substrate having an amorphous oxide layer several microns thick; defining with a mask the layer shape when depositing cobalt as an adhesion layer and platinum as a current collector; using the same mask as the preceding step to sputter deposit $LiCoO_2$ in an argon-oxide gas on the structure while rocking it back and forth; heating the substrate to 300° C. for 30 minutes; sputtering with a new mask that defines the necessary electrolyte area; evaporating a lithium metal anodes using an appropriate shadow mask; and, packaging the cell in a dry-room environment by applying a continuous bead of epoxy around the active cell areas and resting any thin protective (i.e., insulating) over the top thereof.

Still other objects, features and advantages of the present invention will become readily apparent to those skilled in the art from the following detailed description, wherein it is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims. The present invention will become apparent when taken in conjunction with the following description and attached drawings, wherein like characters indicate like parts, and which drawings form a part of this application.

BRIEF DESCRIPTION OF THE DRAWINGS

The general purpose of this invention, as well as a preferred mode of use, its objects and advantages will best be understood by reference to the following detailed description of an illustrative embodiment with reference to the accompanying drawings in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide low process temperature nano-crystalline $LiCoO_2$ thin-film cathodes.

Figure 1A:
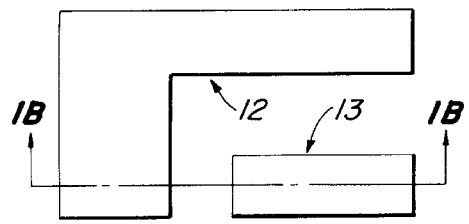
FIG. 1A is a plan view of the beginning steps of the method of the present invention.
Figure 1B:
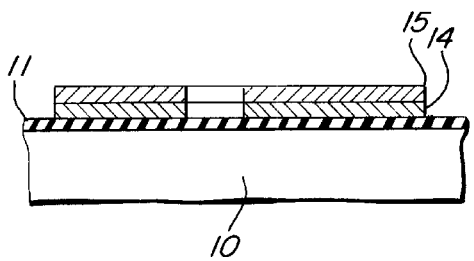
FIG. 1B is a cross-sectional view of the structure shown in FIG. 1A.

Referring now to the drawings and FIG. 1A in particular, a plan view of a beginning step of the process of the present invention is shown. This part of the process is for creating a large area thin-film cathode layer of $LiCoO_2$ that has favorable crystallographic texturing and grain size for use in a thin-film solid state battery system. The process begins with a clean glass substrate 10 having an amorphous oxide layer 11 several microns thick. With the use of a shadow mask (not shown) the beginning elements 12 and 13 of the battery are formed by depositing 100 nm of cobalt as an adhesion layer 14 and 300 nm of platinum as a current collector layer 15. Deposition conditions are 10 mTorr of argon, at 300 W of rf power, with a substrate to target distance of 70 mm. The substrate is kept stationary during growth of layers 14 and 15. The cross-sectional view of FIG. 1B shows the same structural elements with the same reference numerals. The beginning elements 12 and 13 are isolated from each other as shown in FIG. 1A.

Figure 2A:
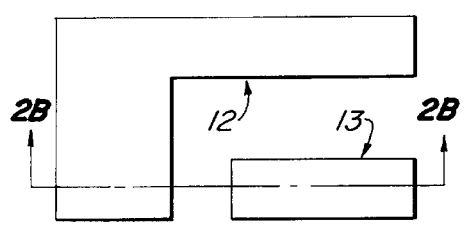
FIG. 2A is a plan view of an intermediate step of the method of the present invention.
Figure 2B:
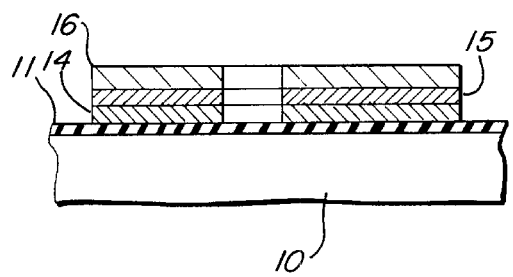
FIG. 2B is a cross-sectional view of the structure shown in FIG. 2A.

Referring now to FIG. 2A, a plan view of an intermediate step of the method of the present invention is shown. The same shadow mask (not shown) used in forming the structure shown in FIGS. 1A and 1B is used in this step as well. Hence, the plan view of FIG. 2A is the same as the plan view of FIG. 1A. However, as can be seen in FIG. 2B, an additional layer 16 of $LiCoO_2$ is deposited to form the cathode. The sputter gas is a 3:1 $Ar:O_2$ mix with a total pressure of 10 mTorr. The substrate to target distance is 70 mm. However, a key difference is depositing this layer 16 is that the substrate is rocked back and forth underneath the target at an amplitude of 5 cm. This motion serves to create an ovular area (approximately 3×5 $cm^2$) on the substrate within which the desired (104) out of plane texture is found. The shadow mask for the cathode layers must be situated within this area to insure proper layer performance. The film thickness can range from 5 to 5000 nm (at least), where the thicker the film corresponds to batteries with a higher capacity.

The substrate is removed from the vacuum sputter chamber (not shown) and is kept in a controlled dry (, 1% humidity) environment. X-ray diffraction is performed on these layers to insure that the cathode layer contains nano-crystalline $LiCoO_2$ grains oriented with their (104) planes parallel to the plane of the substrate. The substrate is then placed in an oven and heated to 300° C. and held at this temperature for 0.5 hours. The oven is located in the dry environment to insure that moisture contact with the cathode layer is minimized. The resulting film layers should have a fully relaxed $LiCoO_2$ hexagonal crystal structure, have some grains that approach 30 nm in diameter, and have a strong (104) out of plane texture.

Figure 3A:
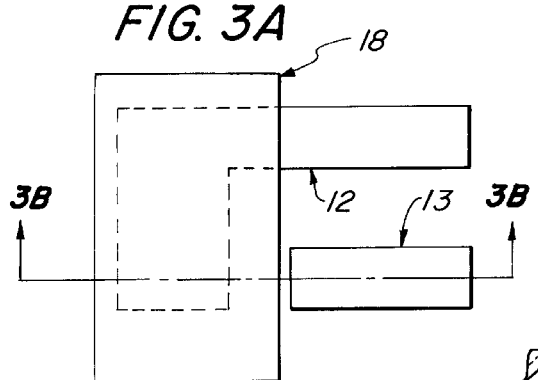
FIG. 3A is a plan view of an intermediate step of the method of the present invention.
Figure 3B:
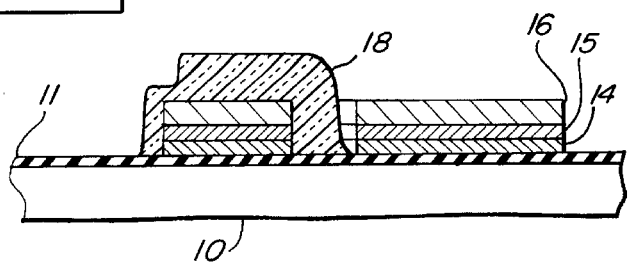
FIG. 3B is a cross-sectional view of the structure shown in FIG. 3A.

Referring now to FIG. 3A, a plan view of the deposition of the LiPON solid electrolyte layer 18 is shown. The substrate and newly added layers is placed back into the sputter chamber with a new shadow mask (not shown) that defines the electrolyte area, thereby forming the layer 18. It is important that the sputter chamber be very clean before starting this step. The substrate to target distance is 90 mm this time, and the substrate holder is a massive metallic object that is kept in thermal contact with the substrate, which helps to cool the substrate during deposition. This precautionary step helps to overcome any non-uniform heating problems. Approximately 1 micron of LiPON is then deposited onto the cathode layer 16 of elements 12 and 13. The LiPON is sputtered from a pressed and sintered $LIPO_43$" sputter target in pure $N_2$ environment. A target power of 100 watts is used. The substrate is again rocked back and forth during growth of the layer 18 as well. Therefore, through a new shadow mask, an electrolyte layer 18 is formed by sputtering a thin film solid state electrolyte material onto the cathode layer 16 while rocking the substrate 10 in an oscillatory fashion.

It has been discovered empirically that the rocking action eliminates localized heating and averages the film composition and thickness over the important areas deposited, thereby greatly reducing lateral variations in the deposited LiPON layer 18. The electrolyte or LiPON layer 18 is grown to a thickness of 1 to 1.5 μm. The electrolyte lithium phosphorus oxynitride (LiPON) is a recently discovered material that has good lithium ion conductivity and, more importantly, is stable in contact with metallic lithium at high voltages.

Figure 4A:
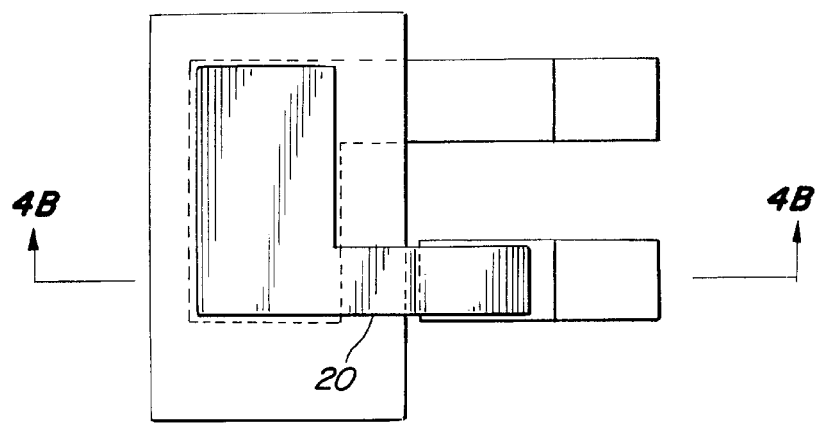
FIG. 4A is a plan view of the penultimate step of the method of the present invention.
Figure 4B:
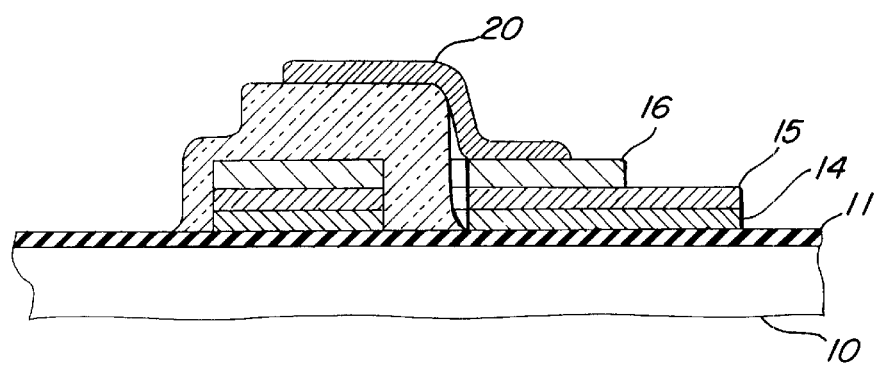
FIG. 4B is cross-sectional view of the structure shown in FIG. 4A.

Referring now to FIG. 4A, a plan view of the resulting structure is shown after a lithium metal anodes 20 is evaporated using an appropriate shadow mask (not shown). In particular, the structure is removed from the deposition chamber, while still warm, and transferred to an evaporation chamber. Using the anode shadow mask, less than 2 microns of lithium are evaporated onto the layer 18, thereby forming the anode layer 20. FIG. 4B shows this same structure in cross-section where the lithium metal anode 20 contacts the top portion of the electrolyte layer 18 above a portion of the beginning element 12 with an isolated portion of the cathode layer 16 above beginning element 13, as shown in FIGS. 1A–4B. This portion above beginning element 13 functions as part of the anode circuit.

Figure 5:
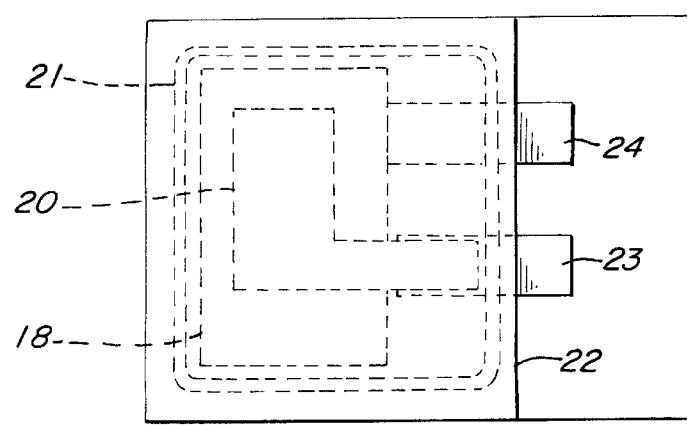
FIG. 5 is a plan view of the resulting structure following steps of the present invention.

Following the above, the structure is sealed in a dry environment by placing a glass cover over it and attaching with epoxy. More specifically, the structure is placed in a dry environment (<1% humidity) to cool after the preceding step of forming the anode layer 20. The active anode/electrolyte area is surrounded with a bead of 5 minute epoxy 21. Care is to be taken here to assure that the leads from the anode and current collector are not fully enclosed by the epoxy bead. Next, a thin insulating protective layer 22 (such as glass) is placed over the active area such that a hermetic seal is created using the epoxy. The assembly is then allowed to dry. As can be seen in the plan: view of FIG. 5, anode lead 23 and a cathode lead 24 are exposed for connection to external circuitry. The result is the thin film battery in accordance with the present invention, which is shown in FIG. 5.

The final step is to connect the battery to a circuit. In order to do this, part of the $LiCO_2$ layer 16 is removed in order to form a good ohmic contact. The part removed is that part exposed outside of the packaging, which is removed by using HCl acid soaked into a wiper. The exposed part is then cleaned with methanol. After this, a bead of solder is melted onto the exposed part of the platinum layer 15 and an electrical lead is welded to the layer 15 by means of the solder. As shown in FIGS. 4B and 5, a portion of the cathode layer 16 not covered by the electrolyte layer 18 is removed with HCl acid to expose the current collecting layer 15. The exposed portions of the current collecting layer 15 form an anode 23 and a cathode 24 comprising the two terminals of the thin-film battery. After exposing and cleaning the anode 23, and the cathode 24, an ohmic contact may be formed between the two terminals of the thin-film battery and a circuit.

The highest capacity thin-film cathode layers ($LiCoO_2$) typically require an annealing step of 700° C. Since this high temperature is not compatible with silicon device technology or flexible polymer substrates, the development of a low process temperature (e.g., <300° C.) cathode layer is required. $LiCoO_2$ thin-films are RF-sputter deposited and subsequently incorporated into thin film batteries. A variety of deposition and post-deposition parameters are varied in an effort to optimize film microstructure and content. Film composition and microstructure are examined using a variety of techniques including x-ray diffraction using synchrotron radiation. It was found that $LiCoO_2$ could be deposited at room temperature in a nano-crystalline state with a strong (104) out of plane texture and a high degree of lattice distortion. By heating these layers to 300° C., the grain size is significantly increased while lattice distortion is eliminated. Cycling data reveals that the heating step increases cell capacity to near theoretical values (at lower discharge currents) while significantly improving both the rate capability and discharge voltage.

The highest capacity per unit volume for a thin film battery, >65 μAh/cm² μm, has been reported from cells fabricated using a $LiCoO_2$ cathode layer in conjunction with a LiPON electrolyte and lithium anode (theoretical capacity approximately 69 μAh/cm² μm). These cells displayed excellent cycle life (over 10,000 cycles), discharge rate capability (mA range), and discharge voltages (>3.9 V). However, it was also reported that a 700° C. anneal of the cathode layer was required; the use of this high temperature precludes the use of many substrates and is not compatible with silicon device processing techniques. Nano-crystalline $LiMn_2O_4$ cathode can be prepared at temperatures less than 300° C., but they display diminished capacities and cannot be effectively discharged at currents greater than 50 μAh/cm².

In an attempt to create the highest possible capacity thin-film battery systems, $LiCoO_3$ is selected as a cathode material. Though there have been numerous reports that $LiCoO_2$ forms a completely amorphous film when RF sputter deposited at room temperature, preliminary work indicates that the desirable polycrystalline or nano-crystalline microstructures could be created at room temperature.

Three-inch lithium cobalt oxide ($LiCoO_2$) sputter targets are prepared by cold pressing and sintering standard powders. The sintering temperature is set to 800–900° C. for 1 hour, and target thicknesses are 4–6 mm. The targets are subsequently bonded to aluminum backing plates using molten indium or silver epoxy.

The growth chamber is a custom-designed turbopumped 3-position RF planar magnetron sputter system configured in the "sputter down" geometry. A rotating substrate platen allows for the growth of multiple films on different substrates, with substrate to target distance of 7 cm. The maximum base pressure before deposition is 3×10⁻⁶ Torr, though most films are grown at base pressures lower than 1×10⁻⁶ Torr. Typically, the $LiCoO_2$ targets are pre-sputtered for 30 minutes before opening the shutter. The cathode films are sputtered in $Ar:O_2$ ratios ranging from 3:1 to 1:1 with a total gas flow rate of 55 sccm and pressure of 10 mTorr. Nominal target power is set to 100 W, giving a power density of 2.2 W/cm². To eliminate lateral compositional variations in the film, the substrate platen was programmed to oscillate underneath the sputter target through a range of 12° at a frequency of 0.3 Hz, a motion that swept the substrate back and forth. This motion produces an area of approximately 4×5 cm on the substrate with uniform color, thickness, and composition. $LiCoO_2$ deposition rate varies linearly depending on the ratio of argon to $O_2$ in the sputter gas; films deposited in 100% argon had a deposition rate of 210+/−5 nm/hr, while a 1:1 mix of argon and $O_2$ resulted in a growth rate of 175+/−10 nm/hr.

The cathode films are deposited onto cleaved test-grade silicon wafers (with native amorphous oxide intact), and C tape for compositional and structural analysis, while glass with molybdenum or platinum current collectors are used as a substrate for cell creation. Thicknesses are determined using an Alpha-Step 100 profilometer. Test cell cathode areas are defined using aluminum masks that define an area of 1.4 cm². After growth, the films are transferred to a dry room (<1% humidity air) where they are subjected to a heating step of 300° C. for 1 hour. Complete thin film batteries are then fabricated using these cathodes and using a sputtered LiPON electrolyte layer and an evaporated Lithium anode. The Lithium anode is evaporated in a Denton thermal evaporator situated inside the dry room. Cathode layer composition may be determined using a combination of Rutherford back scattering (RBS) and inductively coupled plasma mass spectroscopy (ICP-MS).

Film crystalline structure is examined using x-ray diffraction conducted at the Stanford Synchrotron Radiation Laboratory (SSRL). The use of a synchrotron x-ray source is justified because these thin (typically <0.4 $\mu$m), low atomic weight films yield poor counting statistics using laboratory-based x-ray systems, particularly when using the $\theta$-2$\theta$ geometry. A silicon (111) monochrometer is used to select the wavelength of the x-ray beam, 0.124 nm (10 keV), in focused mode. To quantitatively examine texture, the out of plane substrate tilt, X was scanned while $\theta$ and 2$\theta$ were set to satisfy a particular Bragg condition. This type of scan is essentially a cross section of a pole and will be referred herein as a texture plot. The films are kept under a constant helium environment during data collection to avoid moisture contamination.

To examine microstructure and grain size, plan-view transmission electron microscopy may be performed on films that are deposited onto holey carbon grids. All samples are kept in an air-tight, dry environment until immediately before insertion into the TEM.

The electrochemical characteristics of the batteries are examined by cycling them using an Arbin BT-2042 battery testing instrument, while cyclic voltammetry measurements are performed using a PAR 273 potentiostat. Typically, the cells are charged to 4.25 V using a maximum current of 50 $\mu$A, and discharged to 2.5 V at currents ranging from 2 $\mu$A to 1 mA. During the charging cycle, the cells are held at 4.25 V while the charging current decreased to less than 2 $\mu$A.

Compositional Analysis

RBS and ICP-MS analysis show that LiCoO$_2$ film composition depends upon the growth history of the target and composition of the sputter gas. The films grown for the studies described herein are from targets with 5–30 hours of sputtering and have Li/Co ratios of 1.1+/−0.1 with a O/Co ratio of 2.2+/−0.1. These results are consistent with values cited in the literature and indicate that it is likely that a small amount of Li$_2$O is formed during sputtering.

X-ray Diffraction

Figure 6A:
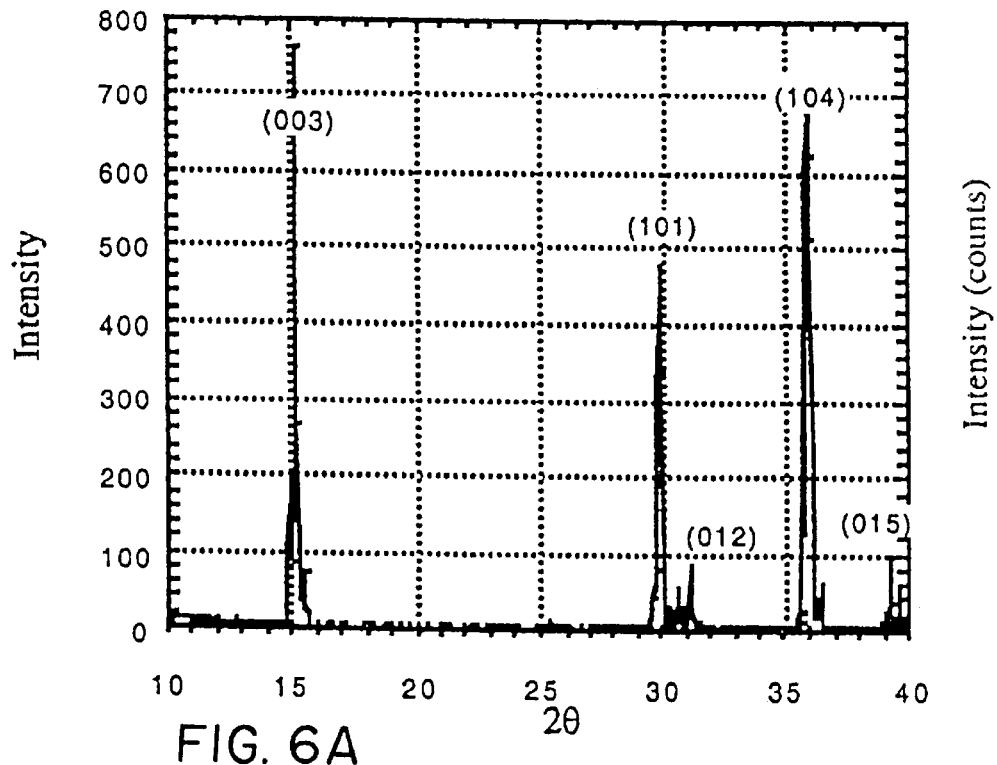
FIGS. 6A and 6B illustrate the results from the synchrotron x-ray diffraction studies of the structure in accordance with the present invention.
Figure 6B:
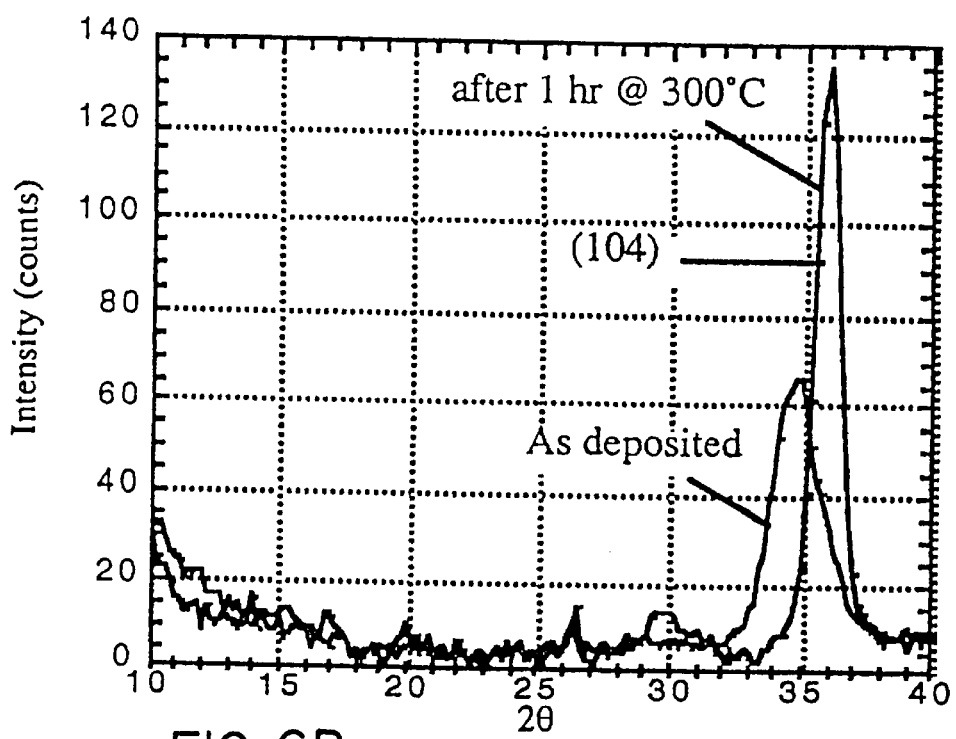

Results from the synchrotron x-ray diffraction studies are shown in FIGS. 6A and 6B, wherein FIG. 6A illustrates a diffraction pattern collected from a LiCoO$_2$ powder standard; that is, collected at SSRL, powder x-ray diffraction pattern of LiCoO$_2$, $\lambda$=1.24A. FIG. 6B illustrates diffraction from 150 nm thick LiCoO$_2$ RF sputter films, before and after the 300° C. heating step.

Using a beam energy of 10 keV ($\lambda$=1.24 A), 5 peaks can be observed in the 2$\theta$ range of 10° to 40°, including the (003), (101), and (104), which are the 3 strongest reflections reported in the literature for sputtered hexagonal LiCoO$_2$ films. FIG. 6B contains diffraction patterns collected from a 150 nm thick LiCoO$_2$ film sputtered in a 1:1 Ar/O$_2$ sputter gas. Silicon substrate and air scattering have been subtracted from these patterns, such that diffraction from only the films is shown. A broad (104) peak is observed for the as-deposited film, showing that this layer is composed of (104) out of plane textured nano-crystalline grains. The effect of heating this film to 300° C. is illustrated in FIG. 6A, where the (104) peak becomes sharper and moves to the predicted equilibrium 2$\theta$ position, at 36.05°.

Figure 7:
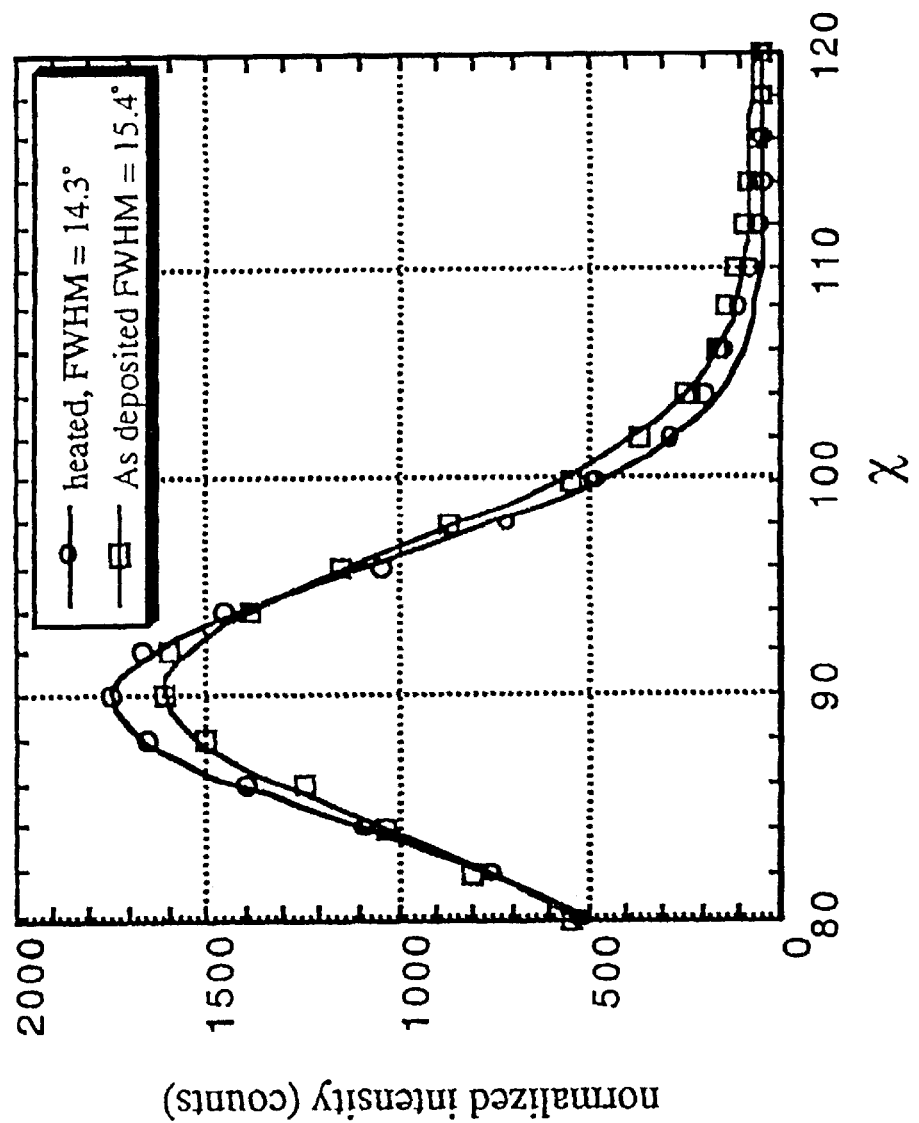
FIG. 7 illustrates normalized (104) X-scan texture data of the structure of the present invention.

FIG. 7 illustrates normalized (104) X-scan texture data. The (104) $\theta$-2$\theta$ diffraction condition is satisfied while the out-of-plane orientation, X, is scanned. The intensity at any X is proportional to the number of LiCoO$_2$ unit cells that are oriented X degrees from the substrate surface normal.

Grain diameters are calculated using the Scherrer formula, and it was found that, as deposited, the grains are 4+/−0.5 nm in diameter, and the heating step increased the average grain diameter to 8+/−1 nm. Similar films grown to thicknesses up to 1.4 $\mu$m all have a strong (104) out of plane. It is interesting to note that if the substrate is kept static (i.e., is not in constant motion underneath the target) during growth, a strong (003) texture developed in some film areas.

The 1.1° peak shifts observed as a result of the heating step corresponds to a 2.6% change in the out-of-plane $d_{(104)}$ lattice parameter. The large value of this change makes it unlikely that this is a simple stress/strain effect. The lattice parameter change observed would require residual stresses orders of magnitude greater than those observed in thin films.

FIG. 7 shows X scan texture plots of the (104) reflection of LiCoO$_2$ before and after the heating step. These data have been normalized to account for the dependence of diffraction volume with respect to X. The intensity of these normalized plots at any X is proportional to the number of unit cells that are in grains that have their (104) plane inclined X° from the substrate plane. The full width at half maximum (FWHM) of a Gaussian curve fit to the data is used as a means to quantify these results. It can be seen that the FWHM decreases from 15.4°+/−0.1°1 to 14.3°+/−0.1° as a result of the heating step. Though this change is statistically significant, it is not large and shows that, while the heating step doubles the average grain size, the degree of texture is not strongly increased.

Figure 8:
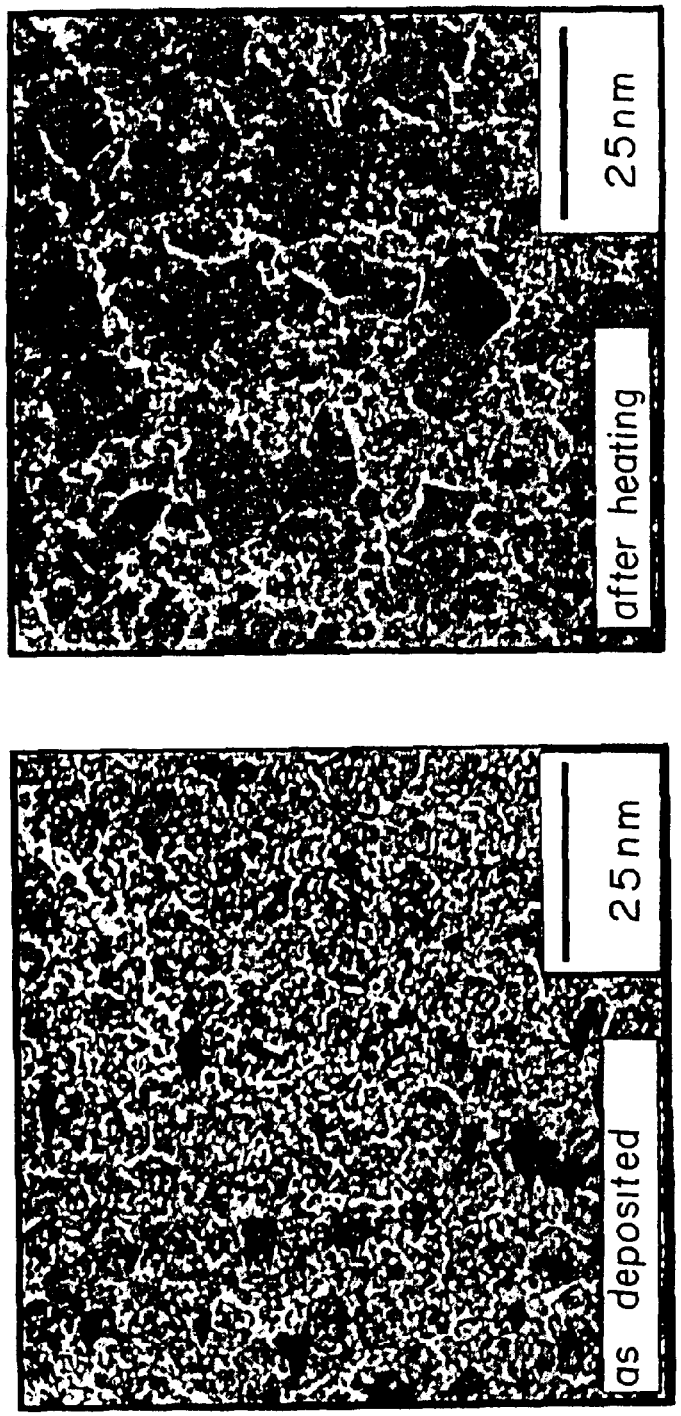
FIG. 8 illustrates the TEM images of 80 nm thick $LiCoO_2$ films sputtered onto holey carbon grids in accordance with the present invention.

The TEM images of 80 nm thick LiCoO$_2$ films sputtered onto holey carbon grids are shown in FIG. 8, wherein it is shown that a TEM analysis of 100 nm thick LiCoO$_2$ films sputtered onto a holey carbon grid. Bright field images are shown for a film before and after heating. Significant grain growth as a result of the heating step may be observed.

The bright field images show that the microstructure is porous and contains well-defined grains that grow as a result of the heating step. As deposited, all the grains are similar in size, whereas after heating, some of the grains have grown to well over 10 nm in diameter whereas other grains show no change at all. The x-ray determination of grain size gives only an average value, so these TEM results are valuable in that they show that heating the films to 300° C. encourages some grains to more than triple their initial size while other grains display no increase at all.

Electrochemical Cycling

Figure 9:
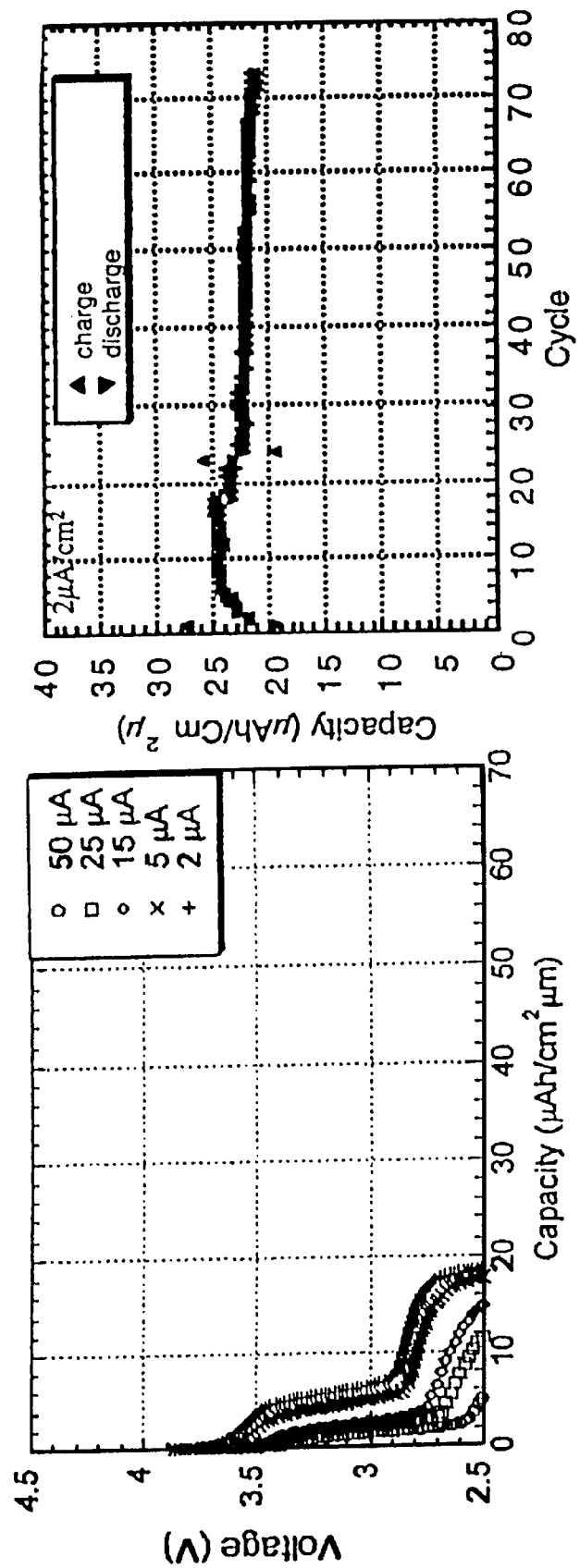
FIG. 9 shows the electrochemical performance of thin film batteries comprising as-deposited 200 nm thick $LiCoO_2$ cathodes.

FIG. 9 shows the electrochemical performance of thin film batteries comprising as-deposited 200 nm thick LiCoO$_2$ cathodes. A voltage plateau is found to exist at approximately 2.8 V, while a discharge rate of even 50 $\mu$A severely limited the cell capacity, indicating that there is significant electronic resistance in these cells. The cycle life of these batteries is found to be limited to 200–300 cycles before losing ¾ of original capacity. FIG. 9 also illustrates the cell discharge data from a thin film solid state battery created using a $LiCoO_2$ cathode deposited at room temperature with no heating step. Discharge currents range from 2 to 50 $\mu A/cm^2$.

Figure 10A:
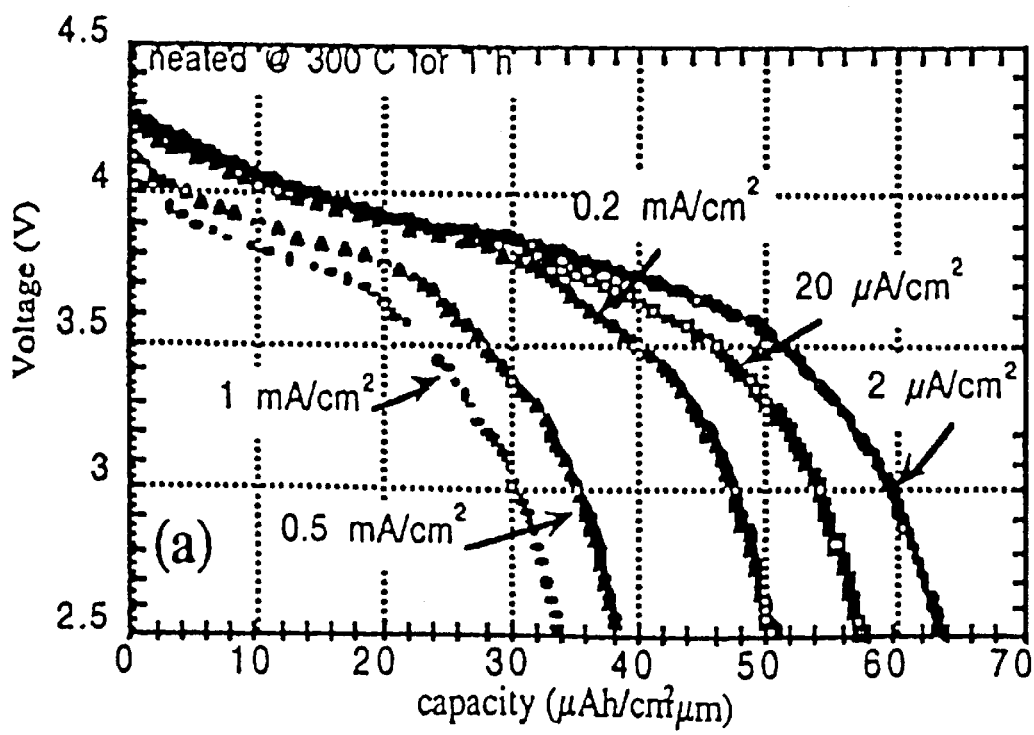
FIG. 10A shows a plot of cell potential vs. capacity for a $LiCoO_2$ thin film battery with a 0.190 $\mu$m thick cathode.
Figure 10B:
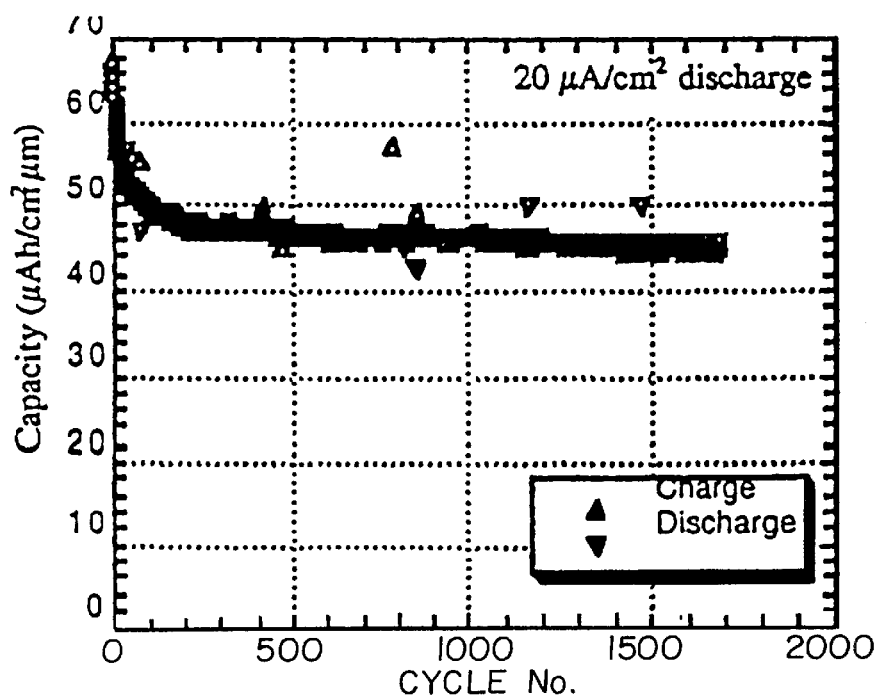
FIG. 10B contains a plot showing the cycle life of a typical heat-treated $LiCoO_2$ cell.

FIG. 10A shows a plot of cell potential vs. capacity for a $LiCoO_2$ thin film battery with a 0.190 $\mu m$ thick cathode that was heated to 300° C. for 1 hour. FIG. 10A shows the cell discharge data from a thin film solid state battery created using a $LiCoO_2$ cathode after the 300° C. heating step. Discharge currents range from 2 $\mu A/cm^2$ to 1 $mA/cm^2$. FIG. 10B shows the charge and discharge capacity versus cycle for a similar cell.

The capacity using a 2 $\mu A/cm^2$ discharge current is 66 $\mu Ah/cm^2$ $\mu m$ (where the $\mu m$ in these units refers to cathode thickness). The discharge voltage has a value of approximately 3.9 V, however there is no perfectly flat voltage plateau.

FIG. 10B contains a plot showing the cycle life of a typical heat-treated $LiCoO_2$ cell. After an initial loss of approximately 20% of the original capacity over the first hundred cycles, the capacity levels out at approximately 46 $\mu Ah/cm^2$ $\mu m$ and maintains at this level for >2000 cycles. The average percent capacity loss per cycle equilibrates at −0.003%/Cycle.

The results shown in FIGS. 6–8 illustrate that polycrystalline $LiCoO_2$ films can be produced without any substrate heating during or after growth. This result contradicts four different previously published reports that state RF sputtered $LiCoO_2$ is amorphous as deposited at room temperature. There are two possible reasons for this difference: [1] Previous studies did not use synchrotron radiation and so were not able to detect scattering from thin $LiCoO_2$ in the θ-2θ geometry for films this thin; or, [2] The combination of growth conditions needed to create these textured nano-cystalline films are not uncovered in other research efforts. It is well known that films sputtered from targets of identical composition can differ dramatically microstructurally depending on the sputter system used, lending credence to possibility [2] above.

The as-deposited films display a strong degree of (104) out-of-plane texturing. It has been reported elsewhere that, upon annealing, most $LiCoO_2$ films thinner than 1 $\mu m$ have at least 10–20% of their grains oriented with the (003) plane parallel to the substrate (thicker films are found to develop either (101) or (104)). In fact, an (003) out of plane texture is observed in certain areas in the films grown in the chamber used for our study if the substrate was held static during deposition. This difference is attributed to composition and environmental gradients inherent in the magnetron sputter environment.

Upon heating to 300° C. for an hour, three trends are observed for the films: [1] the average grain size is found to roughly double. It is further established using TEM analysis that some grains grow to over 3 times their initial size, while others do not change at all. [2] The degree of texturing is found to increase only slightly: from an X-scan FWHM of 15.4° to 14.3°. [3] There is a large change in lattice parameter spacing, as the (104) d-spacing is found to decrease out of the plane of the film by approximately 3% while the in plane spacings expand by approximately 4%. The heating step therefore creates a film containing some significantly larger $LiCoO_2$ crystalline grains that were free of any significant lattice distortion. Electrochemically, it is likely that these qualities combine to create films that are more efficient conductors of both ions and electrons.

The analysis of the electrochemical performance of the batteries built in accordance with this invention indicates that the 300° C. heating step significantly increases cell capacity and discharge voltage. The average discharge voltage rose to approximately 3.8 V from approximately 2.9 V and the rate capability is enhanced such that increasing the discharge rate 3 orders of magnitude (from 2 $\mu A$ to 1 mA) results in a 50% loss in overall capacity for the depth of discharge used. This is a large improvement over the 75% capacity loss observed when the discharge rate is raised to 50 $\mu A$ from 2 $\mu A$ in the batteries created without a heating step.

The cycle life for the cells created using heat-treated cathodes is found to exceed 6000 cycles. During the first 100 cycles, the capacity decreases approximately 25% and is essentially constant for all subsequent cycles. This initial decrease in capacity was not observed in all cases, and the cause of this irreversible capacity loss is currently under investigation.

The viability of creating high-capacity, high discharge rate thin-film batteries at processing temperatures that do not exceed 300° C. has been shown. It is established, in contrast to previous findings, that nano-crystalline highly (104) out-of-plane textured thin rhombohedral films of $LiCoO_2$ can be RF sputter deposited at room temperature and that the materials and electrochemical characteristics are enhanced for these layers upon heating to 300° C. Materials analysis shows that the heating step enables a fraction of the grains to quadruple in size while fully relaxing any lattice strain. Though the rate capability of these cells is not as good as that of cells with 700° C. annealed cathodes, the new low-temperature cells are still able to sustain a 1 mA current load.

While the invention has been particularly shown and described with reference to a preferred embodiment, it will be understood by those skilled in the art that various changes in form and detail may be made therein without departing from the spirit and scope of the invention.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. A method for manufacturing a thin-film battery comprising the steps of:
    a. through a first mask, depositing a first metal as an adhesion layer on a substrate;
    b. through said first mask, depositing a second metal as a current collector over said adhesion layer;
    c. through said first mask, sputtering a cathode layer in an argon-oxide gas on top of said current collector while rocking said substrate in an oscillatory fashion;
    d. heating said substrate in a dry environment of less than 1% humidity to an elevated temperature for a fixed period of time;
    e. through a second mask, sputtering a thin film solid state electrolyte material onto said cathode layer while rocking said substrate in an oscillatory fashion, thereby forming an electrolyte layer;
    f. evaporating an anode layer over said electrolyte layer; and
    g. packaging and sealing the resulting structure.

2. The method as in claim 1 wherein said first metal is cobalt.

3. The method as in claim 1 wherein said second metal is platinum.

4. The method as in claim 1 wherein said cathode layer is a thin film solid state material.

5. The method as in claim 1 wherein said cathode layer is formed of $LiCoO_2$.

6. The method as in claim 1 wherein said electrolyte layer is formed of LiPON.

7. The method as in claim 1 wherein said step of sealing includes applying a bead of epoxy around said thin-film battery in a dry environment and placing a plate thereover.

8. The method as in claim 7 wherein said plate is glass.

9. The method as in claim 1 wherein said substrate is silicon having an insulating layer thereover.

10. The method as in claim 1 wherein said substrate is glass.

11. The method as in claim 1 wherein step d thereof said elevated temperature is 300° C. and said fixed time is 30 minutes.

12. The method as in claim 1 wherein step c thereof said step of rocking includes rocking the substrate back and forth beneath the target with an amplitude of 5 centimeters.

13. The method as in claim 1 where step c thereof further includes the ratio of argon to oxygen gas is in the ration of 3 to 1.

14. The method as in claim 1 where step c thereof further includes the step of holding said substrate 70 millimeters away from the target.

15. The method as in claim 1 further including after step c, said substrate is maintained in a dry environment of less than 1% humidity while performing an X-ray diffraction on said deposited layers to insure that said current collector layer contains nano-crystalline $LiCoO_2$ grains oriented with their (104) planes parallel to the plane of said substrate.

16. The method as in claim 1 wherein step e thereof said electrolyte layer is deposited in a sputter chamber in the presence of pure $N_2$ holding said substrate 90 millimeters from the target using 100 Watts of power.

17. The method as in claim 1 wherein step e thereof said electrolyte is deposited to a thickness of 1 to 1.5 microns.

18. The method as in claim 1 wherein step e thereof further includes rocking said substrate back and forth beneath the target with an amplitude of 5 centimeters.

19. The method as in claim 1 further including removing with HCl acid a portion of the cathode layer not covered by the electrolyte layer to expose a portion of the current collector layer and cleaning the exposed portion of the current collector layer for ohmic contact with circuitry employing said thin-film battery.

20. A method for manufacturing a thin-film battery comprising the steps of:

a through a first mask, depositing cobalt as an adhesion layer on a substrate;

b. through said first mask, depositing platinum as a current collector layer over said adhesion layer;

c. through said first mask, sputtering $LiCoO_2$ as a cathode layer in a 3:1 argon-oxide gas on top of said current collector layer while rocking said substrate under the target in an oscillatory fashion;

d. heating said substrate in a dry environment of less than 1% humidity to 300° C. for thirty minutes;

e through a second mask, sputtering an electrolyte material of LiPON onto said cathode layer while rocking said substrate in an oscillatory fashion, thereby forming an electrolyte layer;

f. evaporating a lithium metal anodes using an appropriate shadow mask; and, g. packaging and sealing the resulting structure.

21. A method for manufacturing a thin-film battery comprising the steps of:

a. through a first mask, depositing a first metal as an adhesion layer on a substrate, the first metal being deposited in a first beginning element region and a second beginning element region, the first beginning element region and the second beginning element region being isolated from each other;

b. through the first mask, depositing a second metal as a current collector over the adhesion layer, the second metal forming a continuation of the first beginning element and the second beginning element;

c. through the first mask, sputtering a cathode layer in an argon-oxide gas on top of the current collector while rocking the substrate in an oscillatory fashion, the cathode layer forming a continuation of the first beginning element and the second beginning element;

d. heating the resulting structure in a dry environment of less than 1% humidity to an elevated temperature for a fixed period of time;

e. through a second mask, sputtering a thin film solid state electrolyte material onto the cathode layer above a portion of the first beginning element while rocking the substrate in an oscillatory fashion, thereby forming an electrolyte layer;

f. through a third mask, evaporating an anode layer over a portion of the electrolyte layer above the first beginning element and a portion of the cathode layer above the second beginning element; and g. packaging and sealing an active area of the structure so that a portion of the first beginning element not covered by the electrolyte layer and a portion of the second beginning element not covered by the anode layer are not enclosed by the packaging and sealing.

22. The method as in claim 21, wherein the packaging and sealing step includes the steps of:

applying an epoxy bead around the active area of the structure; and covering the active area of the structure with an insulating protective layer so that the epoxy bead and the insulating protective layer make a hermetic seal.

23. The method as in claim 21 further including steps of:

h. exposing a portion of the current collector layer covered by the cathode layer not enclosed by the packaging and sealing; and i. cleaning the exposed portion of the current collector layer.

24. The method as in claim 23 wherein the exposing step includes removing with HCl acid a portion of the cathode layer not enclosed by the packaging and sealing to expose a portion of the current collector layer.

25. The method as in claim 23 wherein the cleaning step includes the step of:

applying methanol to the exposed current collector layer.

26. The method as in claim 23 further including step of:

j. melting a bead of solder onto the exposed part of the current collector layer so that an electrical lead is welded to the exposed current collector layer for making ohmic contact with external circuitry.

* * * * *